United States Patent

Ozaki

Patent Number: 6,118,296
Date of Patent: Sep. 12, 2000

[54] SEMICONDUCTOR INTEGRATED LOGIC CIRCUIT

[75] Inventor: Hideharu Ozaki, Tokyo, Japan

[73] Assignee: NEC Corporation, Tokyo, Japan

[21] Appl. No.: 08/828,062

[22] Filed: Mar. 28, 1997

[30] Foreign Application Priority Data

Mar. 28, 1996 [JP] Japan .................................. 8-074083

[51] Int. Cl.$^7$ .................................................. H03K 19/00
[52] U.S. Cl. ................................................. 326/16; 326/39
[58] Field of Search ...................... 326/16, 39; 714/725, 714/726, 727, 729

[56] References Cited

U.S. PATENT DOCUMENTS

| | | | |
|---|---|---|---|
| 4,764,926 | 8/1988 | Knight et al. | 371/22.5 |
| 4,799,004 | 1/1989 | Mori . | |
| 4,864,579 | 9/1989 | Kishida et al. | 371/22.31 |
| 5,459,737 | 10/1995 | Andrews | 371/22.5 |
| 5,491,666 | 2/1996 | Sturges | 365/201 |
| 5,510,704 | 4/1996 | Parker et al. | 324/158.1 |
| 5,568,492 | 10/1996 | Flint et al. | 371/22.1 |
| 5,719,504 | 2/1998 | Yamada | 326/16 |
| 5,867,036 | 2/1999 | Rajsuman | 326/16 |
| 5,872,793 | 2/1999 | Attaway et al. | 371/22.31 |

FOREIGN PATENT DOCUMENTS

| | | |
|---|---|---|
| 63-182585 | 7/1988 | Japan . |
| 2-38979 | 2/1990 | Japan . |
| 6-18632 | 1/1994 | Japan . |

OTHER PUBLICATIONS

VLSI Design, Oct. 1983, "Integrating the Approaches to Structured Design for Testability", Keith Gutfreund, pp. 34–43.

Primary Examiner—Michael Tokar
Assistant Examiner—Anh Tran
Attorney, Agent, or Firm—Foley & Lardner

[57] ABSTRACT

In a semiconductor logic integrated circuit, scan-path-testable flipflop circuits are provided, and scan-path flipflop circuits having a through mode are provided at an input and an output of a macrocell. The scan-path-testable flipflop circuits and the scan-path flipflop circuits having the through mode are cascade-connected. At the time of preparing a test pattern for the scan path test, the test pattern is prepared on the assumption that the macrocell does not exist. On the other hand, a test pattern for testing the macrocell is prepared, and then, is substituted for corresponding flipflop circuit values in the scan pattern. If the scan path test is performed by using the test pattern thus prepared, the test for the macrocell can be executed simultaneously.

1 Claim, 4 Drawing Sheets

Fig. 4A

5 PATTERN FOR SCAN·IN TEST

| 4A | ·· | 4B | 3A | 3B | 3C | 3D | 3E | 3F | 4C | ·· | 4D |
|---|---|---|---|---|---|---|---|---|---|---|---|
| 0 | ·· | 0 | X | X | X | 0 | 1 | 0 | 0 | ·· | 1 |
| 1 | ·· | 0 | X | X | X | 1 | 0 | 0 | 0 | ·· | 1 |
| 0 | ·· | 1 | X | X | X | 0 | 1 | 1 | 0 | ·· | 0 |
| 0 | ·· | 1 | X | X | X | 1 | 0 | 1 | 1 | ·· | 0 |
| 1 | ·· | 0 | X | X | X | 0 | 1 | 0 | 1 | ·· | 0 |

6 INPUT TEST PATTERN

Fig. 4B

7 PATTERN FOR SCAN·OUT TEST

| 4A | ·· | 4B | 3A | 3B | 3C | 3D | 3E | 3F | 4C | ·· | 4D |
|---|---|---|---|---|---|---|---|---|---|---|---|
| 0 | ·· | 1 | 1 | 0 | 0 | X | X | X | 0 | ·· | 0 |
| 0 | ·· | 1 | 0 | 1 | 0 | X | X | X | 0 | ·· | 1 |
| 0 | ·· | 0 | 1 | 0 | 1 | X | X | X | 1 | ·· | 1 |
| 1 | ·· | 0 | 0 | 1 | 1 | X | X | X | 1 | ·· | 0 |
| 1 | ·· | 0 | 1 | 0 | 0 | X | X | X | 0 | ·· | 0 |

8 OUTPUT TEST PATTERN

Fig. 4C

9 PATTERN FOR MACROCELL TEST

| I1 | I2 | I3 | O1 | O2 | O3 |
|---|---|---|---|---|---|
| 0 | 0 | 0 | 1 | 1 | 1 |
| 1 | 0 | 0 | 1 | 0 | 1 |
| 0 | 1 | 0 | 1 | 0 | 0 |
| 1 | 1 | 1 | 1 | 1 | 0 |
| 0 | 0 | 1 | 0 | 0 | 1 |

11 OUTPUT TEST PATTERN
10 INPUT TEST PATTERN

SEMICONDUCTOR INTEGRATED LOGIC CIRCUIT

BACKGROUND OF THE INVENTION

1. Field of the Invention

The present invention relates to a semiconductor integrated logic circuit, and more specifically to a semiconductor logic integrated circuit having a scan path testing function.

2. Description of Related Art

In the prior art, in the case of testing a semiconductor logic integrated circuit, a so called scan path test method has been used in order to realize controllability of the circuit and to improve observability.

However, this scan path test method is not perfect. When an integrated circuit includes a large-scaled macrocell such as a memory circuit (RAM, etc.), it is difficult to test all of the integrated circuit by the scan path test method. In this case, the scan path test method and another test method must be used in combination.

FIG. 1 is a block diagram of the semiconductor logic integrated circuit for illustrating one prior art example. As shown in FIG. 1, a prior art semiconductor logic integrated circuit 1a including a large-scaled macrocell 2 includes flipflop circuits (called "F/F circuit" hereinafter) 4A and 4D enabling a scan path test. In the scan path testing, these F/F circuits 4A and 4D are connected in cascade between a scan path test input terminal SCAN•IN and a scan path test output terminal SCAN•OUT, in order to test an internal circuit, etc. In this case, the internal cascaded F/F circuits 4A and 4D are set to arbitrary values through the input terminal SCAN•IN directly from an external, and the value of the F/F circuits 4A and 4D are read out directly to the output terminal SCAN•OUT.

In addition, the semiconductor logic integrated circuit 1a includes a built-in self test circuit (called a "BIST circuit" hereinafter) 16 for automatically generating a test pattern when the large-scaled macrocell 2 is tested. In this case, a control signal and a clock are supplied from a macrocell test input to the BIST circuit 16, and further, a latch-off signal is supplied from the macrocell test input. This latch-off signal is a signal. for turning off input latch circuits 14 and output latch circuits 15 which are used when a normal data input/output is carried out for the macrocell 2. On the basis of the control signal from the test input, the BIST circuit 16 accesses the macrocell 2, and outputs a signal indicative of whether or not a read-out data is normal, to a macrocell test output. The testing of the macrocell 2 is conducted by checking, outside of the integrated circuit, the signal indicative of whether or not the read-out data is normal. Incidentally, in the course of the macrocell testing, the input and output latch circuits 14 and 15 are maintained off in order to prevent an input/output of another data.

As mentioned above, at the time of testing the prior art semiconductor logic integrated circuit 1a, it is necessary to use the scanpath-testable F/F circuits 4A and 4D for testing an ordinary internal circuit, and on the other hand, when the integrated circuit includes the memory circuit such as the RAM, as the macrocell 2, it is necessary to previously provide for example the BIST circuit 16 internally in the integrated circuit.

When the semiconductor logic integrated circuit adopting the above mentioned prior art scan path test method includes the large-scaled macrocell, since the macrocell is large in scale, a different testing method must be used in testing the macrocell. In this case, accordingly, another testing terminal is disadvantageously required in addition to the test terminals required for the scan path test method.

In addition, in the prior art semiconductor logic integrated circuit, whether or not the logic condition of a first stage of the input latch circuits and a final stage of the output latch circuit is normal, cannot disadvantageously be ascertained by either the scan path testing or the testing of the macrocell.

Furthermore, in the prior art semiconductor logic integrated circuit, since a test pattern required for the scan path test and a different test pattern for the macrocell test, etc. are separately used, a test time disadvantageously becomes long.

SUMMARY OF THE INVENTION

Accordingly, it is an object of the present invention to provide a semiconductor logic integrated circuit which has overcome the above mentioned problems of the prior art.

Another object of the present invention is to provide a semiconductor logic integrated circuit having a scan path test function, capable of carrying out a logic test for input and output stages of the macrocell, without increasing the number of test terminals.

Still another object of the present invention is to provide a semiconductor logic integrated circuit having a scan path test function, capable of carrying out the test of the macrocell and of shortening the test time.

A semiconductor logic integrated circuit in accordance with the present invention includes a large-scaled macrocell having input and output terminals, a plurality of scan flipflop circuits connected to the input and output terminals of the large-scaled macrocell, respectively, for supplying input data to the large-scaled macrocell and receiving output data from the large-scaled macrocell, the plurality of scan flipflop circuits having a through mode capable of causing data to pass through when the plurality of scan flipflop circuits are connected in cascade, and a plurality of scan-path-testable flipflop circuits operating as a shift register when the plurality of scan-path-testable flipflop circuits are connected in cascade, so that, in a normal operation, data is inputted and outputted by only the plurality of scan flipflop circuits having the through mode, and in a scan path test, the plurality of scan flipflop circuits having the through mode and the plurality of scan-path-testable flipflop circuits are connected in cascade.

In addition, each of the plurality of scan flipflop circuits having the through mode in the semiconductor logic integrated circuit in accordance with the present invention includes a flipflop receiving and outputting the input/output data and a test data, and a selector for selecting the input data and the output data outputted from the flipflop to output the selected one to the large-scaled macrocell.

Furthermore, when a test pattern for performing the scan path test in the semiconductor logic integrated circuit in accordance with the present invention is prepared, a test pattern having an indefinite signal supplied to an input of the scan flipflop circuits having the through mode, which are connected at an output side of the large-scaled macrocell is prepared. Respective values of the test pattern for the scan flipflop circuits having the through mode, which are connected at an input side of the large-scaled macrocell, are replaced with input values of the test pattern separately prepared for testing the large-scaled macrocell, and respective values of the test pattern for the scan flipflop circuits having the through mode, which are connected at the output side of the large-scaled macrocell, are replaced with output values of the test pattern separately prepared for testing the large-scaled macrocell.

BRIEF DESCRIPTION OF THE DRAWINGS

FIGS. 4A, 4B and 4C illustrate an example of an scan-in test pattern, a scan-out test pattern and a macrocell test pattern, used for testing semiconductor logic integrated circuit shown in FIG. 2.

DESCRIPTION OF THE PREFERRED EMBODIMENTS

Now, an embodiment of the semiconductor logic integrated circuit in accordance with the present invention will be described with reference to the accompanying drawings.

Figure 1:
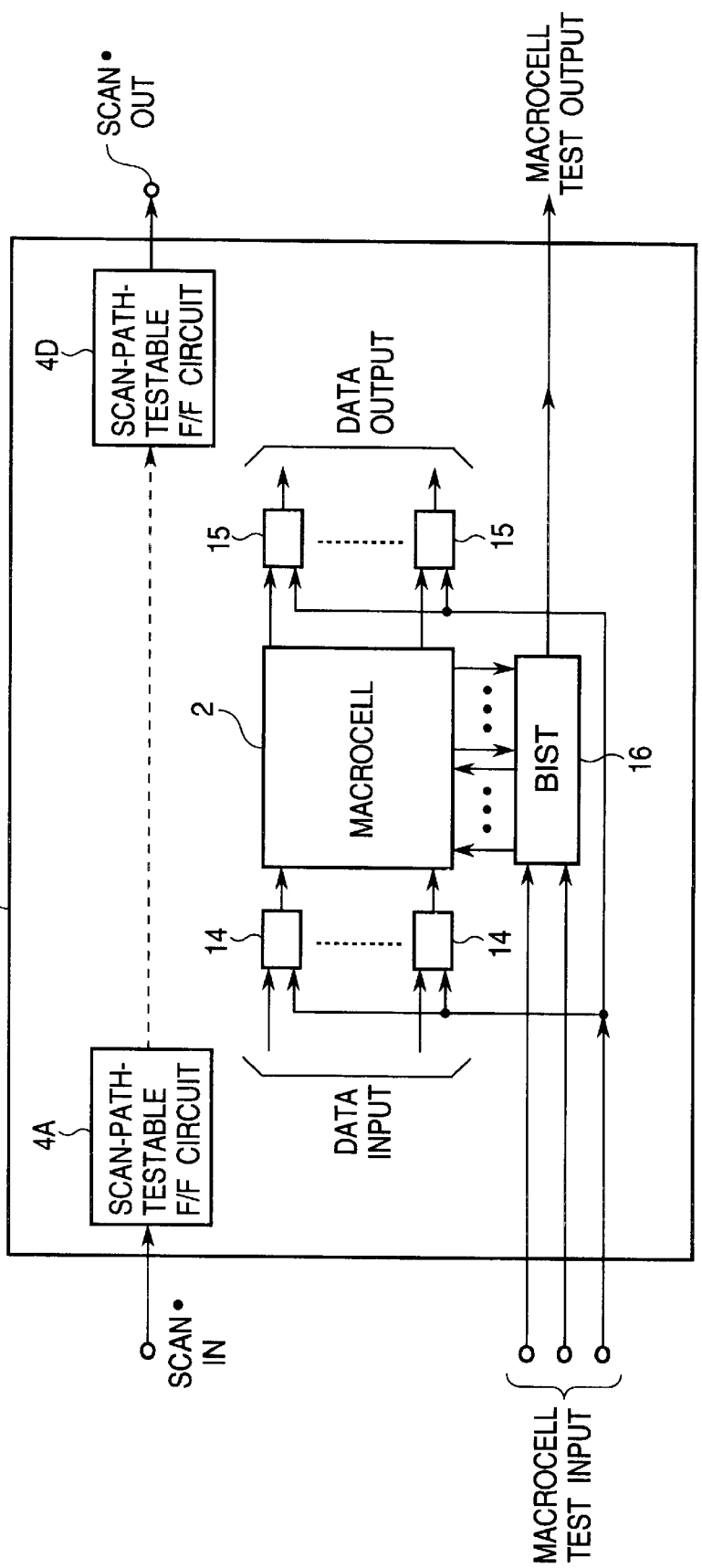
FIG. 1 is a block diagram of the prior art semiconductor logic integrated circuit.
Figure 2:
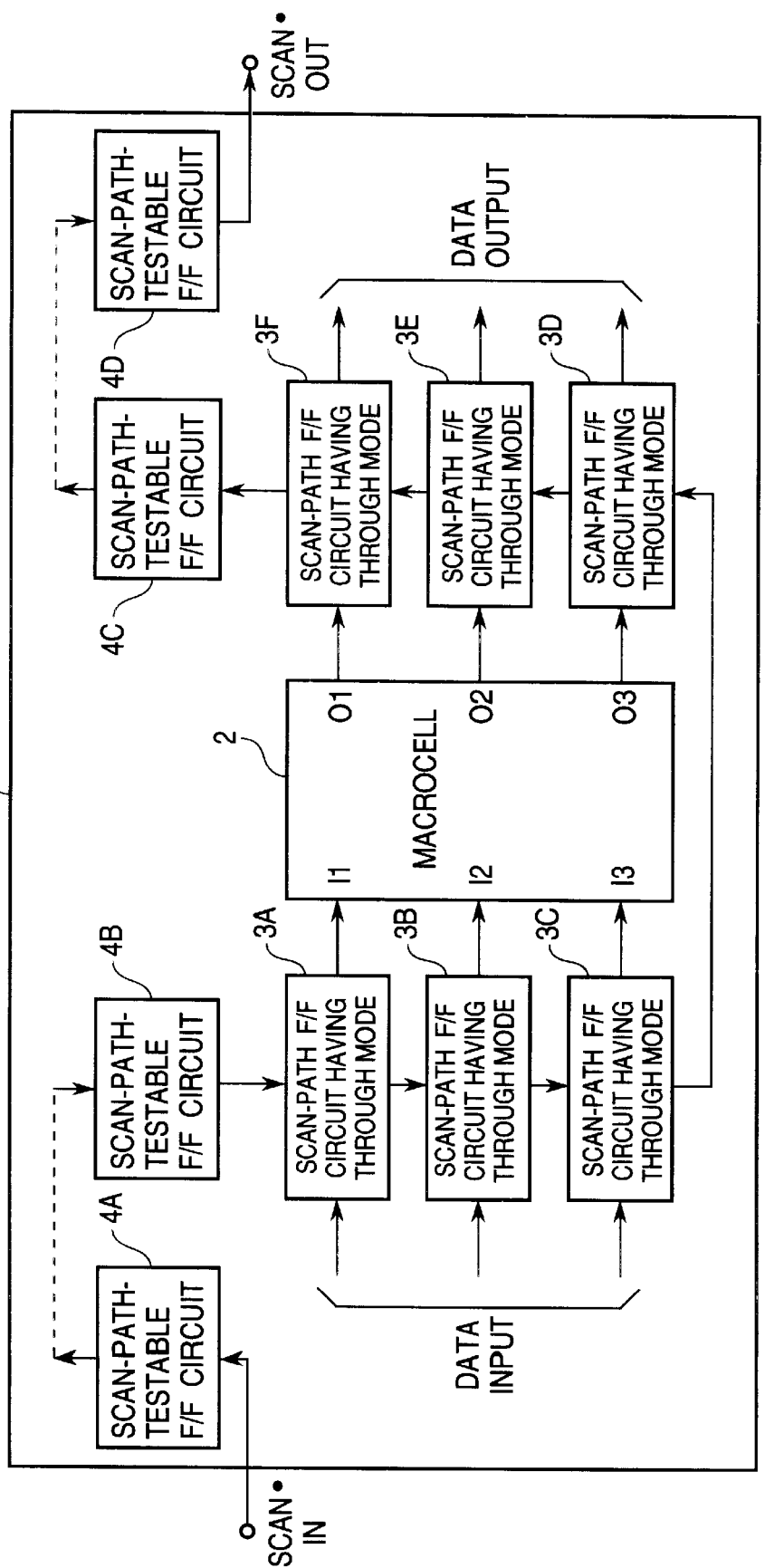
FIG. 2 is a block diagram of a first embodiment of the semiconductor logic integrated circuit in accordance with the present invention.

FIG. 2 is a block diagram of the semiconductor logic integrated circuit for illustrating one embodiment of the present invention. As shown in FIG. 2, the semiconductor logic integrated circuit 1 in the shown embodiment, includes a plurality of internally provided flipflop circuits, which are connected in cascade to operate as a shift register, in order to enable to perform a scan path test. In addition, with replacement of a portion of a test pattern, a large-scaled macrocell 2 can be simultaneously tested simultaneously with the scan path test.

For this purpose, the semiconductor logic integrated circuit 1 includes a plurality of internally provided F/F circuits, namely, scan-path-testable F/F circuits 4A to 4D, and scan-path F/F circuits 3A to 3F having the through mode, which are connected to a data input and a data output of the macrocell 2. When the scan path test is to be performed, all of these F/F circuits are connected in cascade to operate as a shift register, and a scan path test pattern is used to perform the scan path test. On the other hand, when the large-scaled macrocell 2 is to be tested, a portion of the scan path test pattern is replaced by a macrocell test pattern, and the large-scaled macrocell 2 is tested by using the above mentioned scan-path F/F circuits 3A to 3F.

Particularly, the F/F circuits 3A to 3F provided at the data input and the data output of the macrocell 2 have not only a function of selecting an input signal or an output signal of the macrocell 2, but also a function of allowing a signal to pass through in a normal operation, and on the other hand, of allowing the signal to be scanned through these F/F circuits 3A to 3F in a testing operation. Namely, these F/F circuits 3A to 3F can be inserted into a cascaded path of the scan-path-testable F/F circuits 4A to 4D.

First, the large-scaled macrocell 2 can store data, and has input terminals I1 to I3 and output terminals O1 to O3. The scan-path F/F circuits 3A to 3C having the through mode are connected at the input side (namely, to the input terminals I1 to I3) of the large-scaled macrocell 2 in order to supply input data to the large-scaled macrocell 2, and similarly, the scan-path F/F circuits 3D to 3F having the through mode are connected at the output side (namely, to the output terminals O1 to O3) of the large-scaled macrocell 2 in order to read out output data from the large-scaled macrocell 2. The large-scaled macrocell 2 and the F/F circuits 3A to 3F are used in a normal operation.

Furthermore, the semiconductor logic integrated circuit 1 includes the scan-path-testable F/F circuits 4A to 4D, in addition to the scan-path F/F circuits 3A to 3F having the through mode. The scan-path-testable F/F circuits 4A, to 4D are cascade-connected together with the scan-path F/F circuits 3A to 3F, in order to create a scan path between a scan-in terminal SCAN•IN and a scan-out terminal SCAN•OUT. Each of these F/F circuits 4A to 4D is constituted of a conventional flipflop circuit having no through mode.

In brief, the data inputting/outputting of the macrocell 2 in the normal operation is carried out by utilizing the through mode of the scan-path F/F circuits 3A to 3F having the through mode. On the other hand, the testing operation is executed by cascade-connecting the scan-path-testable F/F circuits 4A to 4D and the scan-path F/F circuits 3A to 3F having the through mode.

Figure 3:
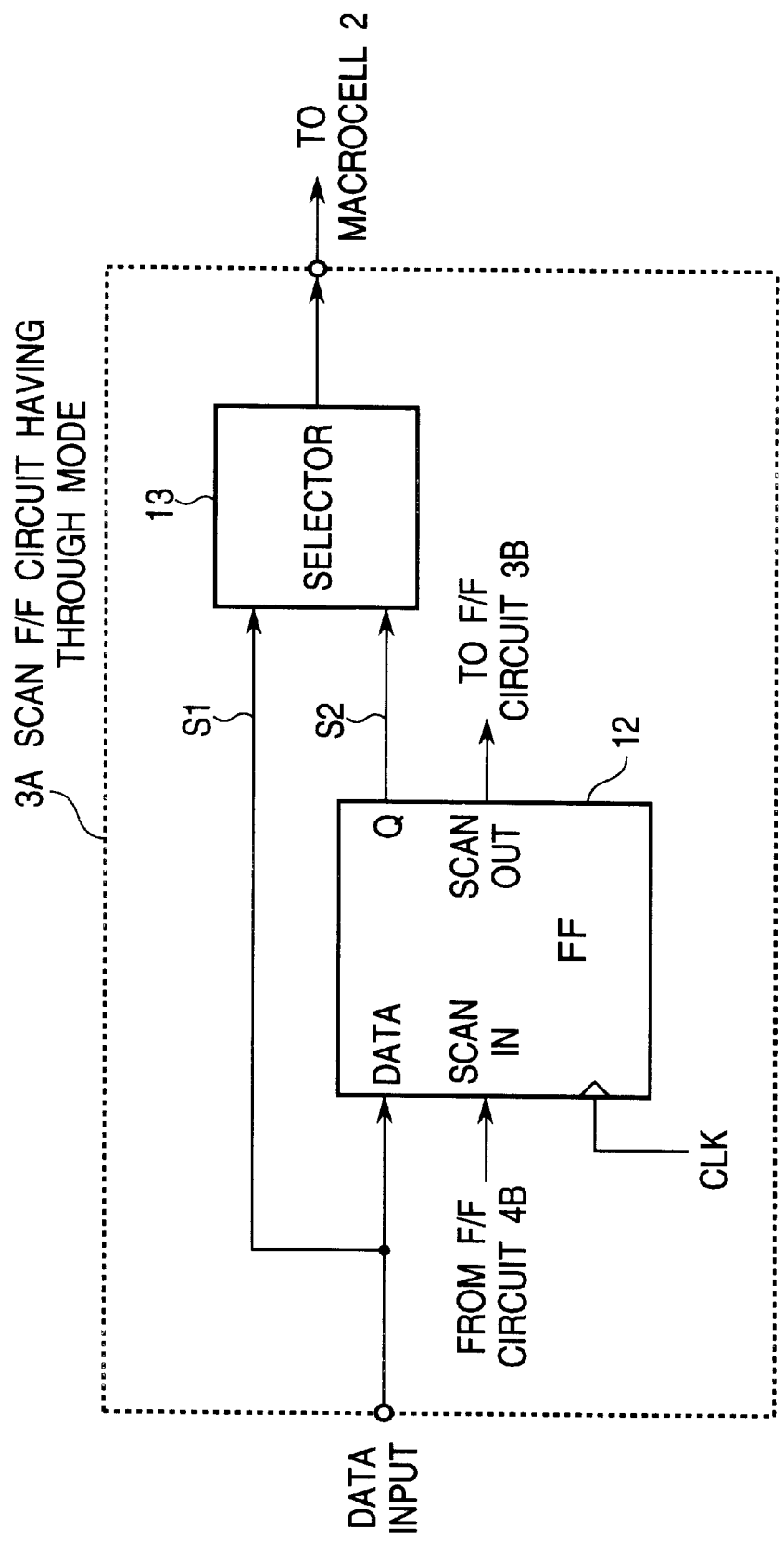
FIG. 3 is a function circuit diagram of the scan flipflop circuit having the through mode, incorporated in the semiconductor logic integrated circuit shown in FIG. 2.

FIG. 3 is a circuit diagram of the scan-path F/F circuit having the through mode, shown in FIG. 2. The shown scan-path F/F circuit 3A having the through mode is constructed similarly to the other scan-path F/F circuits 3B to 3F having the through mode, and includes a flipflop (F/F) 12 synchronized with a clock signal CLK and having a data input terminal DATA for receiving input data in the normal operation, a scan-in terminal SCAN IN for receiving a test pattern from the scan-path-testable F/F circuit 4B, an output terminal Q for outputting output data in the normal operation, a scan-out terminal SCAN OUT for outputting the test pattern to the scan-path F/F circuit 3B having the through mode, and a selector 13 receiving data S1 and data S2 for outputting a selected one to the macrocell 2.

In the normal operation, the input data Si bypasses the F/F 12, and is outputted through the selector 13 to the macrocell 12 (in the F/F circuit 3F, the output data from the macrocell 2 bypasses the F/F 12 and is outputted through the selector 13).

In the scan testing, data (value) to be inputted to the input terminal I1 of the macrocell 2 is supplied from the terminal SCAN•IN, and then, shifted by a shift register operation to the scan-in terminal SCAN IN of the F/F 12 of the F/F circuit 3A, so that it is inputted through the output S2 and the selector 13 to the input terminal I1 of the macrocell 2. Similarly, the output O3 of the macrocell 2 is outputted through the F/F circuit 3F to the terminal SCAN•OUT by the shifter register operation. In addition, the data input in FIG. 2 is fetched in the scan-path F/F circuits 3A to 3C having the through mode, and is outputted to the terminal SCAN•OUT by the shifter register operation.

FIGS. 4A, 4B and 4C illustrate an example of a scan-in test pattern, a scan-out test pattern and a macrocell test pattern, used in the circuit shown in FIG. 2.

First, as shown in FIG. 4A, the scan-in test pattern 5 is a scan path test pattern prepared on the basis of the scan path test method, by assuming that the macrocell 2 does not exist. In this scan-in test pattern, the values in the F/F circuits 4A to 4D and the F/F circuits 3A to 3F are values which are shifted in and shifted out in these F/F circuits connected in cascade, in the course of the scan path testing. Since it is assumed in this scan-in test pattern 5 that the macrocell 2 does not exist, an input test pattern 6 (values to be set) in the scan-path F/F circuits 3A to 3C having the through mode, at the scan-in time, is indefinite (marked by "x").

As shown in FIG. 4B, in the scan-out test pattern 7, an output test pattern 8 in the scan-path F/F circuits 3D to 3F having the through mode, at the scan-out time, is indefinite (marked by "x"), similarly to FIG. 4A.

Furthermore, as shown in FIG. 4C, the macrocell test pattern 9 for testing the macrocell 2 includes an input test pattern 10 to be inputted to the input terminals I1 to I3 of the macrocell, and an output test pattern 11 outputted from the output terminals O1 to O3 of the macrocell. This input test pattern 10 is an input test pattern for testing the macrocell 2, and similarly, the output test pattern 11 is an output test pattern for testing the macrocell.

In testing the macrocell 2, the values of the terminals 3A, 3B and 3C in the scan-in test pattern 5 shown in FIG. 4A, namely, the input test pattern 6 is replaced by the input test pattern 10 shown in FIG. 4C, and the values of the terminals 3D, 3E and 3F in the scan-out test pattern 7 shown in FIG. 4B, namely, the output test pattern 8, is replaced by the output test pattern 11 shown in FIG. 4C.

In this embodiment, by replacing a portion of the scan path test patterns shown in FIGS. 4A and 4B with the macrocell test pattern shown in FIG. 4C as mentioned above, the test of the ordinary logic circuit and the test of the macrocell can be simultaneously performed without adding a terminal for testing the macrocell.

In the scan path test for the ordinary logic circuit, the test data is inputted from the scan-in terminal SCAN IN to be set in the scan-pathtest-able F/F circuits 4A and 4B and the scan-path F/F circuits 3A to 3C having the through mode, and the logic circuit is caused to operate. Then, the values of the scan-path-testable F/F circuits 4C and 4D and the scan-path F/F circuits 3D to 3F having the through mode, are read out from the terminal SCAN•OUT. By repeating this operation, the test of the logic circuit is performed. In this case, if the test pattern is used which is obtained by replacing the input test pattern 6 in FIG. 4A with the input test pattern 10 shown in FIG. 4C, or by replacing the output test pattern 8 in FIG. 4B with the output test pattern 11 shown in FIG. 4C, the input test pattern 10 in the macrocell test pattern 9 is set in the scan-path F/F circuits 3A to 3C having the through mode at the scan-in time, so that the test data is supplied to the input terminals I1 to I3 of the macrocell 2. As a result, since the data in the output terminals O1 to O3 is retained in the scan-path F/F circuits 3D to 3F having the through mode at the scan-out time, it is possible to collate the macrocell output pattern substituted in a portion of the test pattern 5 shown in FIG. 4A. In other words, if the test pattern obtained by replacing a portion of the test pattern shown in FIG. 4A by the test pattern 9 shown in FIG. 4C is used, it is possible to simultaneously test the whole of the semiconductor logic integrated circuit.

Incidentally, when the input test pattern 6 and the output test pattern 8 which are a portion of the test patterns shown in FIGS. 4A and 4B are replaced by the test pattern 9 shown in FIG. 4C, if the scan path test pattern is longer than the macrocell test pattern, the scan path test pattern is filled up with an indefinite pattern or by repeating the macrocell test pattern. On the contrary, if the macrocell test pattern is longer than the scan path test pattern, it is sufficient if a similar procedure is taken.

In the above mentioned embodiment, explanation has been made about the case that the large-scaled macrocell is one. However, it is a matter of course that, when a plurality of macrocells are provided, a similar test can be performed by cascade-connecting the plurality of macrocells. In the shown embodiment, the scan-path F/F circuits having the through mode are connected directly to each other. However, a similar test can be realized even if the scan-path-testable F/F circuit is inserted between the scan-path F/F circuits having the through mode.

As seen from the above, the semiconductor logic integrated circuit in accordance with the present invention includes the F/F circuits having the through mode, provided at the input/output of the macrocell, in addition to the scan-path-testable F/F circuits. In the normal operation, data is caused to pass through the F/F circuits having the through mode, and only in the test operation, the F/F circuits having the through mode and the scan-path-testable F/F circuits are cascade-connected, so as to make unnecessary the terminal for testing the large-scaled macrocell.

In the semiconductor logic integrated circuit in accordance with the present invention, the F/F circuits having the through mode are cascade-connected, and on the other hand, the test pattern is modified to some extent to realize a common test pattern. With this arrangement, the logic of the input/output stages of the macrocell can be ascertained, and also, the test of the large-scaled macrocell can be performed simultaneously at the scan path test. As a result, the test time can be advantageously shortened.

I claim:

1. A semiconductor logic integrated circuit comprising:

a macrocell having input and output terminals, a plurality of scan flipflop circuits connected to the input and output terminals of the macrocell, respectively, for supplying input data to the macrocell and receiving output data from the macrocell, the plurality of scan flipflop circuits having a through mode capable of causing data to pass through when the plurality of scan flipflop circuits are connected in cascade, and a plurality of scan-path-testable flipflop circuits operating as a shift register when the plurality of scan-path-testable flipflop circuits are connected in cascade, wherein in a normal operation, said input data and said output data are inputted and outputted by only the plurality of scan flipflop circuits having the through mode, and in a scan path test, the plurality of scan flipflop circuits having the through mode and the pluralitly of scan-path-testable flipflop circuits are connected in cascade for transmitting test data to said logic integrated circuit including said macrocell and wherein when a test pattern for performing the scan path test in the semiconductor logic integrated circuit is prepared, a test pattern having an indefinite signal supplied to an input of the scan flipflop circuits having the through mode, which are connected at an input side of the macrocell is prepared, and a test pattern having an indefinite signal supplied to an output of the scan flipflop circuits having the through mode, which are connected at an output side of the macrocell is prepared and respective values of the test pattern for the scan flipflop circuits having the through mode, which are connected at an input side of the macrocell, are replaced with input values of the test pattern separately prepared for testing the macrocell, and respective values of a test pattern for the scan flipflop circuits having the through mode, which are connected at the output side of the macrocell, are replaced with output values of a test pattern separately prepared for testing the macrocell.

* * * * *